(12) United States Patent
Pellizzer et al.

(10) Patent No.: US 6,974,734 B2
(45) Date of Patent: Dec. 13, 2005

(54) PROCESS FOR MANUFACTURING A MEMORY DEVICE, IN PARTICULAR A PHASE CHANGE MEMORY, INCLUDING A SILICIDATION STEP

(75) Inventors: Fabio Pellizzer, Follina (IT); Roberto Bez, Milan (IT); Marina Tosi, Trezzo Sull'adda (IT)

(73) Assignees: STMicroelectronics S.r.l., Agrate Brianza (IT); Ovonyx, Inc., Boise, ID (US)

( * ) Notice: Subject to any disclaimer, the term of this patent is extended or adjusted under 35 U.S.C. 154(b) by 28 days.

(21) Appl. No.: 10/758,289

(22) Filed: Jan. 15, 2004

(65) Prior Publication Data

US 2004/0214415 A1 Oct. 28, 2004

(30) Foreign Application Priority Data

Jan. 15, 2003 (EP) .................................. 03425017

(51) Int. Cl.⁷ ....................... H01L 21/338; H01L 29/94
(52) U.S. Cl. ....................... 438/182; 365/158; 257/382
(58) Field of Search ........................................ 438/182

(56) References Cited

U.S. PATENT DOCUMENTS 6,177,306 B1    1/2001  Wu ............................ 438/241
6,573,130 B1 *  6/2003  Patelmo et al. ............. 438/201
2002/0177292 A1  11/2002  Dennison ..................... 438/587
2003/0219924 A1 * 11/2003  Bez et al. .................... 438/102

FOREIGN PATENT DOCUMENTS

EP           1318552 A1    6/2003

* cited by examiner

Primary Examiner—David Nelms
Assistant Examiner—Lee Calvin
(74) Attorney, Agent, or Firm—Lisa K. Jorgenson; Hai Han; SEED IP Law Group PLLC

(57) ABSTRACT

A process wherein an insulating region is formed in a body at least around an array portion of a semiconductor body; a gate electrode of semiconductor material is formed on top of a circuitry portion of the semiconductor body; a first silicide protection mask is formed on top of the array portion; the gate electrode and the active areas of the circuitry portion are silicided and the first silicide protection mask is removed. The first silicide protection mask (is of polysilicon and is formed simultaneously with the gate electrode. A second silicide protection mask of dielectric material covering the first silicide protection mask is formed before silicidation of the gate electrode. The second silicide protection mask is formed simultaneously with spacers formed laterally to the gate electrode.

18 Claims, 6 Drawing Sheets

PROCESS FOR MANUFACTURING A MEMORY DEVICE, IN PARTICULAR A PHASE CHANGE MEMORY, INCLUDING A SILICIDATION STEP

BACKGROUND OF THE INVENTION

1. Field of the Invention

The present invention relates to a process for manufacturing a memory device, in particular a phase change memory, including a silicidation step.

2. Description of the Related Art

As is known, phase change memory cells utilize a class of materials that have the unique property of being reversibly switchable from one phase to another with measurable distinct electrical properties associated with each phase. For example, these materials may change between an amorphous disordered phase and a crystalline, or polycrystalline, ordered phase. A material property that may change and provide a signature for each phase is the material resistivity, which is considerably different in the two states.

At present, alloys of elements of group VI of the periodic table, such as Te or Se, referred to as chalcogenides or chalcogenic materials, can advantageously be used in phase change cells. The currently most promising chalcogenide is formed by a Ge, Sb and Te alloy ($Ge_2Sb_2Te_5$), which is currently widely used for storing information in overwritable disks.

In chalcogenides, the resistivity varies by two or more orders of magnitude when the material passes from the amorphous phase (more resistive) to the polycrystalline phase (more conductive) and vice versa, as shown in FIG. 1. Furthermore, in the amorphous phase, resistivity strongly depends also on temperature, with variations of one order of magnitude every 100° C., with a behavior similar to that of P-type semiconductor materials.

Phase change may be obtained by locally increasing the temperature, as shown in FIG. 2. Below 150° C. both phases are stable. Above 200° C. (temperature of start of nucleation, designated by $T_x$), fast nucleation of the crystallites takes place, and, if the material is kept at the crystallization temperature for a sufficient length of time (time $t_2$), it changes its phase and becomes crystalline. To bring the chalcogenide back into the amorphous state, it is necessary to raise the temperature above the melting temperature $T_m$ (approximately 600° C.) and then to cool the chalcogenide off rapidly (time $t_1$).

From the electrical standpoint, it is possible to reach both critical temperatures, namely the crystallization and the melting temperatures, by causing a current to flow through a resistive element which heats the chalcogenic material by Joule effect.

The basic structure of a PCM element 1 which operates according to the principles described above is shown in FIG. 3 and comprises a first electrode 2 of resistive type, forming a heater, a programmable element 3 and a second electrode 5. The programmable element 3 is made of a chalcogenide and is normally in the polycrystalline state at the completion of processing. One part of the programmable element 3 is in direct contact with the first electrode 2 and forms the active portion affected by phase change, referred to as the phase change portion 4.

The use of the PCM element 1 of FIG. 3 has been already proposed to form memory cells. To avoid noise caused by adjacent cells, the PCM element 1 is generally coupled with a selection element, such as a MOS transistor or a bipolar transistor.

Furthermore, the PCM cells, forming a memory array, should be integrated with circuitry for controlling operation thereof. A manufacturing process compatible with a standard CMOS flow has been already proposed in U.S. application Ser. No. 10/313,991, filed Dec. 5, 2002, entitled "Small area contact region, high efficiency phase change memory cell, and fabrication method thereof".

According to this process and referring to FIG. 4, a wafer 10 comprises an array portion 50 and a circuitry portion 51 and includes a substrate 7 and an epitaxial layer 8. First, the wafer 10 is subject to initial manufacturing steps to define active areas in the epitaxial layer 8. To this end, field insulating regions 13 are formed within the substrate, e.g., using the "shallow trench" technology. Then, in the array portion 50, buried subcollector regions 9 of $P^+$-type are implanted to extend down to the substrate 7. After annealing, in the circuitry portion 51, N-wells 18 and P-wells 19 are implanted, using separate masks. Furthermore, doping of the channels of the periphery transistors is carried out.

Thereafter, an oxide layer 20 is grown onto the entire surface of the wafer 10 and a polysilicon layer is deposited. The polysilicon layer is then defined, to form gate electrodes 16 of the periphery transistors. After source and drain reoxidation, LDD implants are carried out for both P-channel and N-channel periphery transistors, to form P-type, light doped regions 40 and analogous, N-type light doped regions 44.

Then, a silicide protection mask (not shown) is formed over the array portion; an oxide layer is deposited onto the whole wafer 10 and etched, to form spacers 41 on the sides of the gate electrodes 16; source and drain regions 42 for the periphery transistors are implanted and self-aligned silicide regions 43 are grown over the gate electrodes 16 and the source and drain regions 42.

After removing the silicide protection mask, collector regions 11 of P-type and base regions 12 of N-type are implanted over the buried subcollector regions 9; then a nitride layer 45 is deposited.

Thereafter, a dielectric layer 21 is deposited and planarized. Then dielectric layer 21 and nitride layer 45 are etched where contact are to be formed so as to uncover portions of silicide regions 43 and base region 12.

Then, in a manner not shown, a base contact region 15 of $N^+$-type and, subsequently, an emitter region 14 of $P^+$-type are implanted into base region 12. Thus, the structure of FIG. 4 is obtained.

Thereafter, the first electrode 2 and the programmable element 3 of FIG. 3 are formed, to provide a sub-lithographic contact area.

BRIEF SUMMARY OF THE INVENTION

According to the present invention, there is provided a process for manufacturing an electronic semiconductor device, as defined in claim 1.

According to one aspect of the invention, when defining the polysilicon gate electrodes of the circuitry transistors, the polysilicon layer and the underlying gate oxide layer are left on the array portion and define the silicide protection mask. Thereby, when the silicide protection mask is to be removed, the gate oxide layer operates as an etch stop layer and avoids damage of silicon. On the other hand, removal of the gate oxide layer does not cause a substantial removal of the oxide of the field insulating regions or an appreciable damage of the active area surface, due to the reduced thickness of the gate oxide layer and thus the reduced over-etch of the field oxide, as explained in detail below.

BRIEF DESCRIPTION OF THE SEVERAL VIEWS OF THE DRAWINGS

For the understanding of the present invention, a preferred embodiment is now described, purely as a non-limitative example, with reference to the enclosed drawings, wherein.

DETAILED DESCRIPTION OF THE INVENTION

U.S. application Ser. No. 10/680,727, filed Oct. 7, 2003, entitled "Array of Cells Including a Selection Bipolar Transistor and Fabrication Method Thereof", discloses a highly compact layout for an array of bipolar transistors operating as selection elements. According to this prior layout, the selection elements are implemented as actual bipolar transistors and each base region is shared by at least two adjacent bipolar transistors, as visible from the mask layout in FIG. 5 and the device cross-section in FIG. 6.

Figure 4:
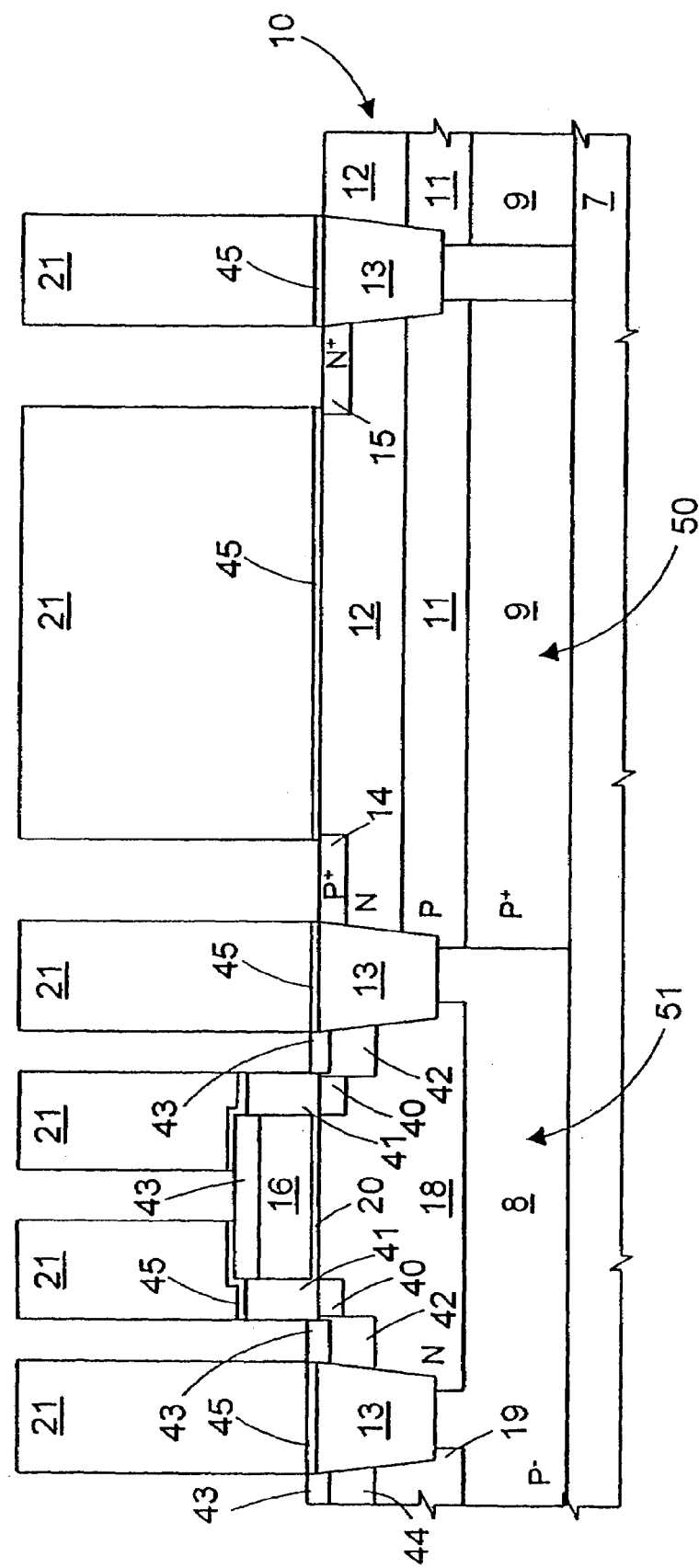
FIG. 4 shows a cross-section of a prior device including circuitry transistors and PCM memory devices.
Figure 5:
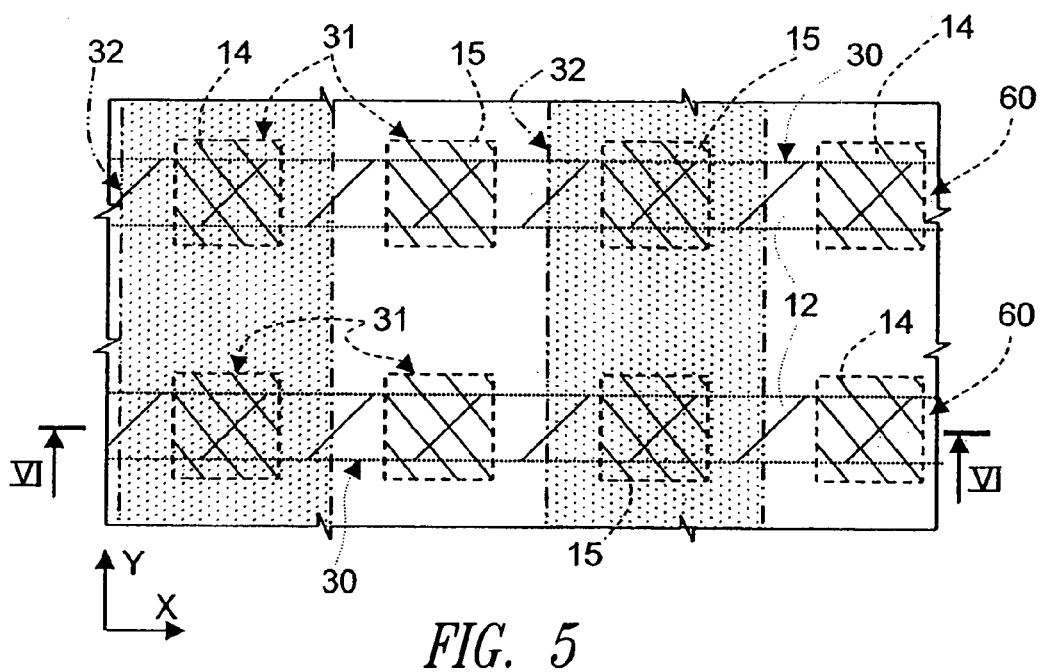
FIG. 5 shows the masks used for a cell array according to another prior solution.
Figure 6:
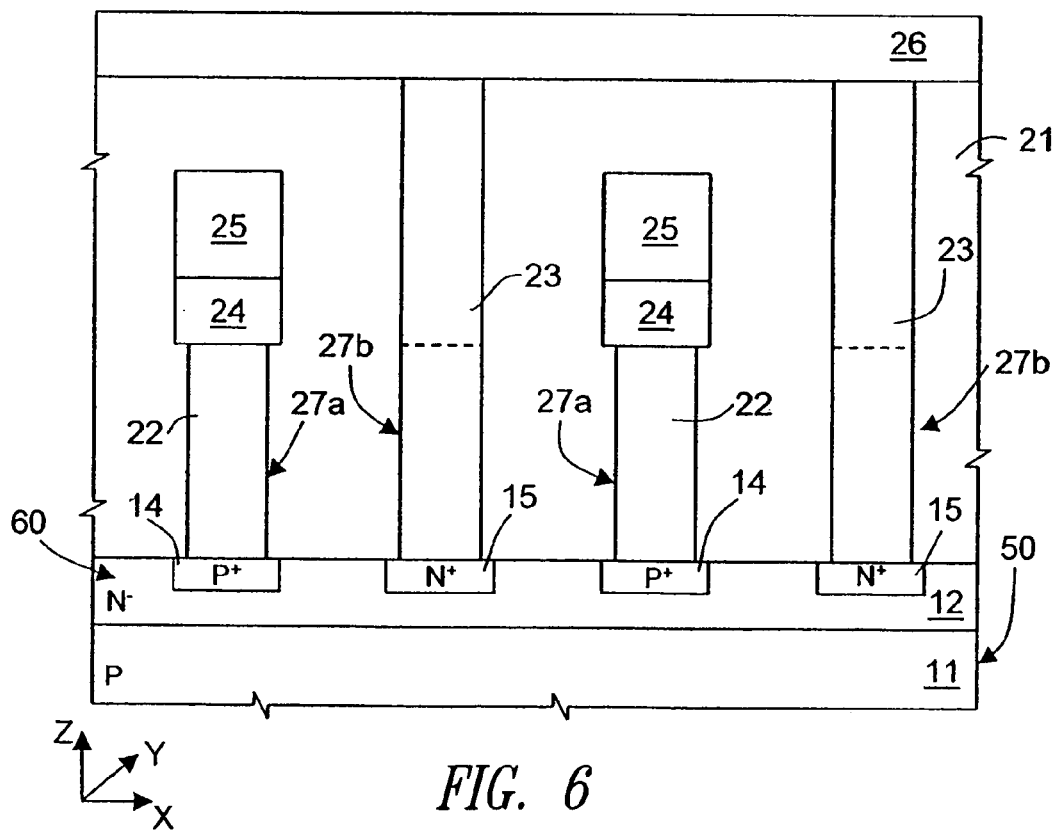
FIG. 6 shows a cross-section of a device obtained using the masks of FIG. 5, taken along line VI—VI of FIG. 5.

As shown in FIGS. 5 and 6, wherein the various regions have been identified by the same reference numbers used in FIG. 4, the array portion 50 houses a plurality of active area strips 60 that extend parallel to each other along a first direction (X-direction), according to active area mask 30 of FIG. 5. Each active area strip 60 accommodates a base region 12 so that each base region 12 is electrically insulated from the adjacent base regions 12 by field insulating portions 13 (FIG. 4).

Each base region 12 accommodates a plurality of emitter regions 14 (formed using an emitter mask 32 of FIG. 5), and a plurality of base contact regions 15, of $N^+$-type (formed using a mask opposite to emitter mask 32); as visible, in the cross-section of FIG. 6, the emitter regions 14 and the base contact regions 15 are arranged alternately.

As further visible from FIG. 6, contacts 22, 23 extend in openings 27a, 27b of the dielectric region 21, formed using a contact mask 31, shown in FIG. 5.

Figure 1:
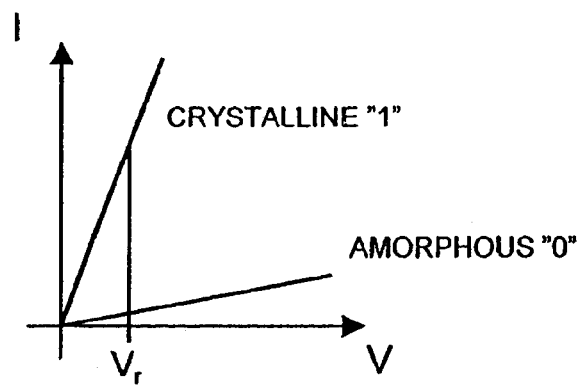
FIG. 1 illustrates the characteristic low field current-voltage of a phase change material.
Figure 2:
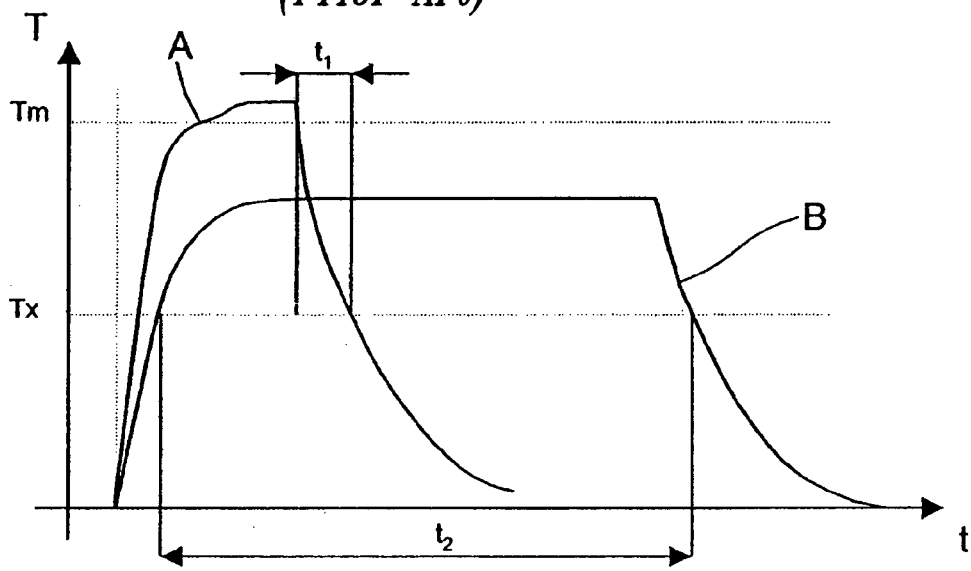
FIG. 2 shows the temperature versus time plot of a phase change material.
Figure 3:
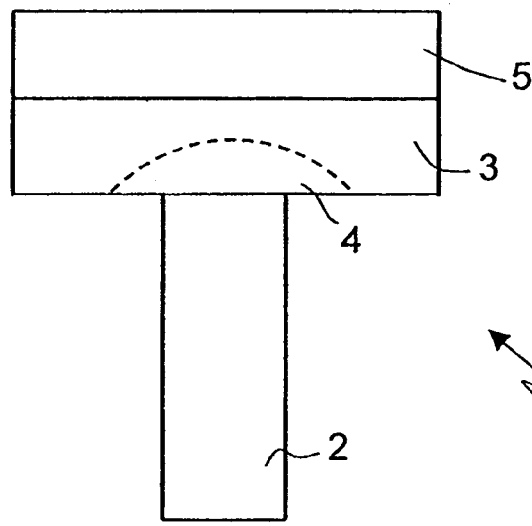
FIG. 3 shows the basic structure of a PCM memory element.

Contacts 22 extend from emitter regions 14 to a chalcogenic storage element 24 forming the programmable element 3 of FIG. 3. Bit lines 25 extend along a second direction (Y-direction), and are in contact with the chalcogenic storage elements 24.

Contacts 23 extend from base contact regions 15 to word lines 26 extending along the X-direction.

The manufacture of a PCM array having the layout disclosed in U.S. application Ser. No. 10/680,727 using the process taught in U.S. application Ser. No. 10/313,991 raises some problems. In fact, if a silicide is grown on the active area strips 12 of the array portion 50 during silicidation of the circuitry portion 51, this silicide would cause short-circuit between all the base contact regions 15 and the emitter regions 14 arranged in a same base region 12 and should thus be avoided. On the other hand, making the silicide protection mask of sacrificial oxide, as in standard processes, is disadvantageous.

Indeed, the silicide protection mask should be completely removed after silicidation to allow the deposit of the nitride layer 45 and thus to open so-called borderless contacts in the active area strips 60 of the array portion 50. The nitride layer 45 is necessary to increase etch selectivity towards the field insulating regions 13 during opening of the contacts in the dielectric layer 21.

However, etching of the silicide protection mask is very critical, since it is an oxide etch that should stop on the silicon of the active areas 60 and on the oxide of the field insulating regions 13. In particular, this etch should have a good selectivity with respect to silicon so as to ensure a good quality of silicon and should ensure the right implant depth of the emitter and base contact regions 14 and 15. Furthermore, etching of the silicide protection mask should not remove a sensible portion of the field insulating regions 13, in particular in the neighborhood of the base regions 12, to ensure sufficient isolation thereof.

However, tests have shown that the standard approach brings about the formation of craters in the field insulating regions 13 and an unacceptable level of defects of the memory array.

Indeed, considering a sacrificial oxide depth of 200–300 nm and imposing an over-etch of only 10%, which is necessary to ensure complete removal of the sacrificial oxide, a removal of at least 20–30 nm of oxide of the field insulating regions 13 at the border with the base regions strips 12 is to be taken into account; however, removal of such a portion of the field insulating regions 13 may cause short-circuit problems.

If the spacers 41 are formed by a double oxide-nitride layer, less problems are encountered; however, not all the manufacture processes of the circuitry devices require spacers of such a double layer and binding of manufacture process to the specific material of the spacers is not desired.

The present invention addresses the problems discussed above. In the following, same reference numbers will be used for the parts in common with the prior device of FIG. 4 and FIG. 6.

Figure 7:
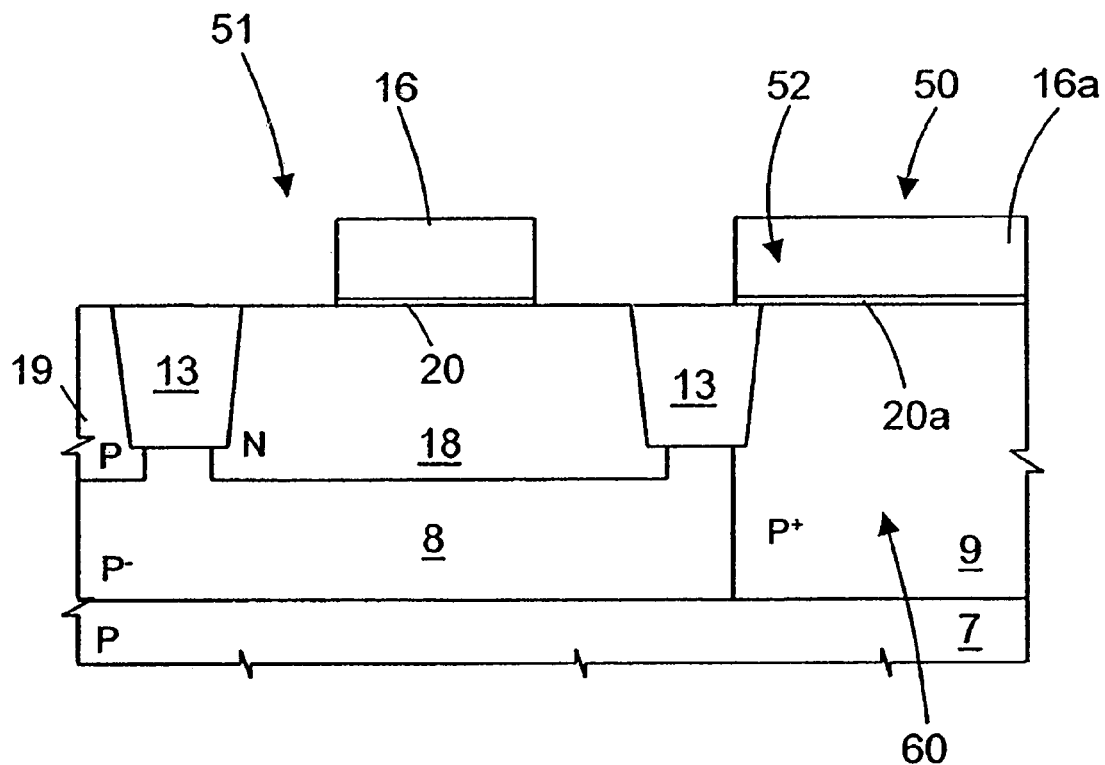
FIGS. 7–12 are cross-sections of a semiconductor wafer, in subsequent manufacturing steps according to an embodiment of the present invention.

In detail, FIG. 7 shows a cross-section of semiconductor wafer 10 taken along the same cross-section plane of FIG. 6. Wafer 10, comprising an array portion 50 and a circuitry portion 51, is shown after defining the active areas 60 (forming the field insulating regions 13), forming the buried subcollector regions 9, forming the N-wells 18 and P-wells 19, and defining the gate electrodes 16.

Preferably, the active areas 60 have a strip-like shape derived from the use of active area mask 30 of FIG. 5.

According to FIG. 7, while defining the gate electrodes 16, a polysilicon portion 16a and an oxide portion 20a are left on the surface of the wafer 10 in the entire array portion 50, thus forming a first silicide protection mask 52.

Figure 8:
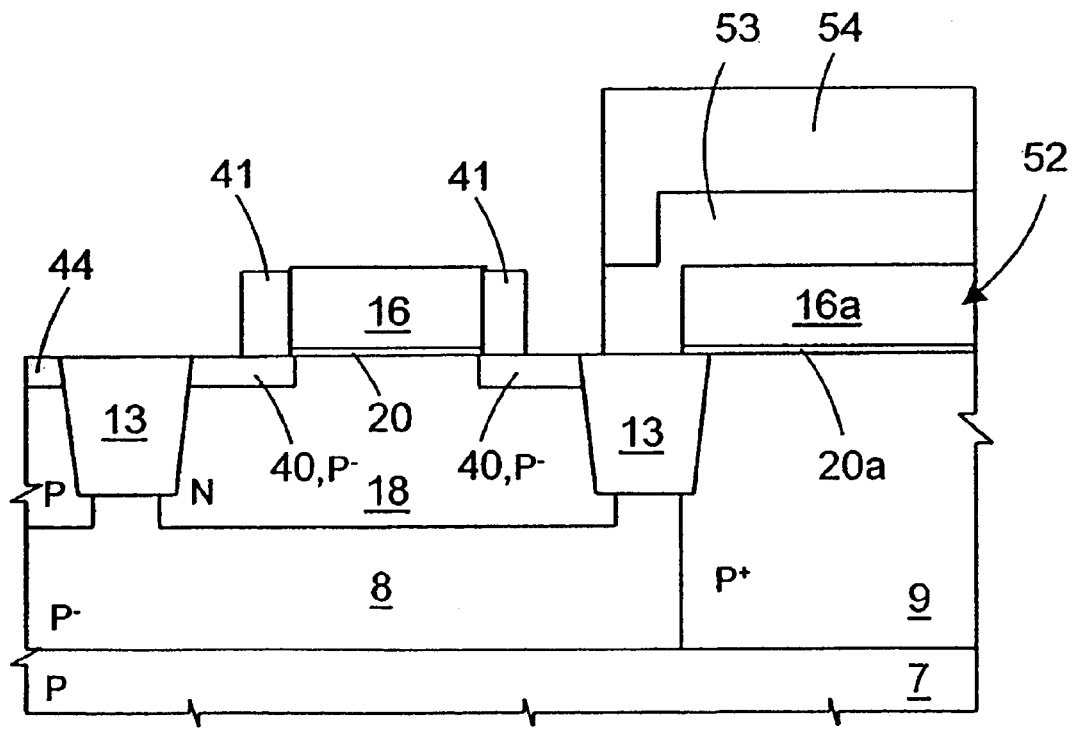

Then, as shown in FIG. 8, LDD implants are carried out to form light doped regions 40 and 44, as in the prior process; and a sacrificial oxide layer is deposited onto the whole wafer 10 and anisotropically etched using a mask 54 covering the array portion 50. Thus, spacers 41 are formed on the lateral sides of the gate electrodes 16, in a per se known manner, and a second silicide protection mask 53 is formed over the array portion 50, completely covering the first silicide protection mask 52 and extending also on the lateral sides of first silicide protection mask 52, on top of the border portion of the field insulating region 13 surrounding the array portion 50, as visible in FIG. 8.

Figure 9:
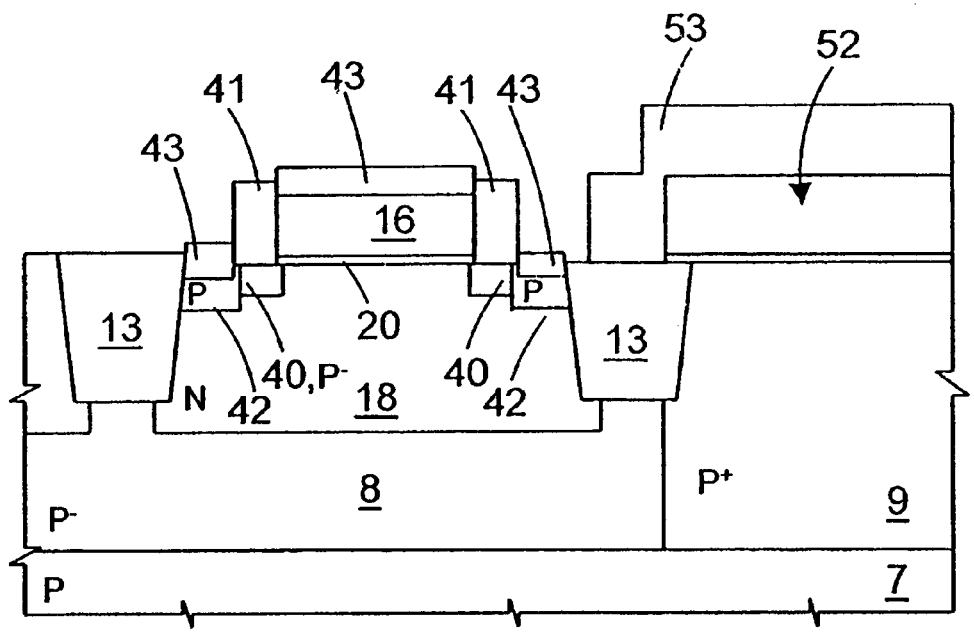

After removal of mask 54, as shown in FIG. 9, source and drain regions 42 for the periphery transistors are implanted and silicide regions 43 are grown over the gate electrodes 16 and the source and drain regions 42. In the array portion 50, the second silicide protection mask 53 prevents silicidation of the polysilicon portion 16a of first silicide protection mask 52.

Figure 10:
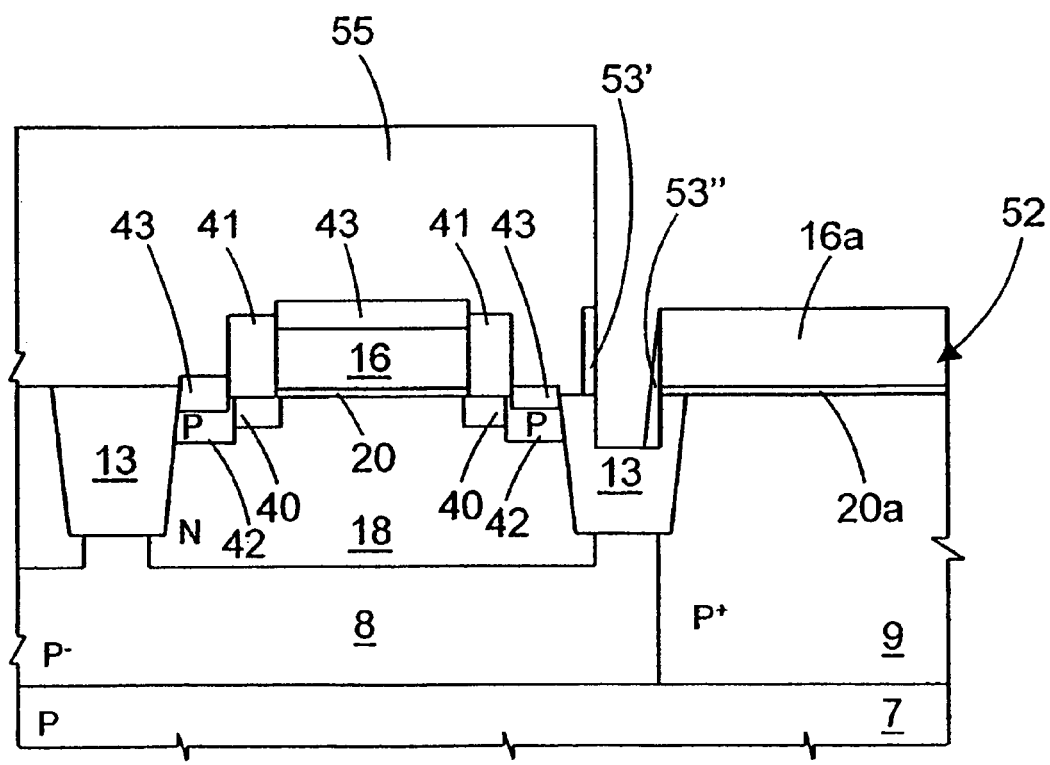

Then, as shown in FIG. 10, the second silicide protection mask 53 of sacrificial oxide is removed using a resist mask 55 and using a highly selective etching that does not affect polysilicon, thus cleaning up any defects deriving from the process steps (pre-amorphization implants, rapid thermal treatments, and so on) acting on the sacrificial oxide. This etching may cause also the removal of oxide of the field insulating region 13 surrounding the array portion 50, as shown in FIG. 10; however, this removal is not critical, as discussed below.

Using the same resist mask 55, polysilicon portion 16a is removed using a standard polysilicon etch (the same used for gate definition) that stops on the oxide portion 20a, owing to the very good selectivity.

Thereafter, the silicon surface is cleaned, removing the oxide portion 20a. In this step, a thin portion of the oxide of the field insulation regions 13 in the array portion 50 may also be removed; however, by virtue of the reduced thickness of the oxide portion 20a (the same as an LV gate oxide), this removal is not detrimental to the electrical properties of the field insulation regions 13.

Figure 11:
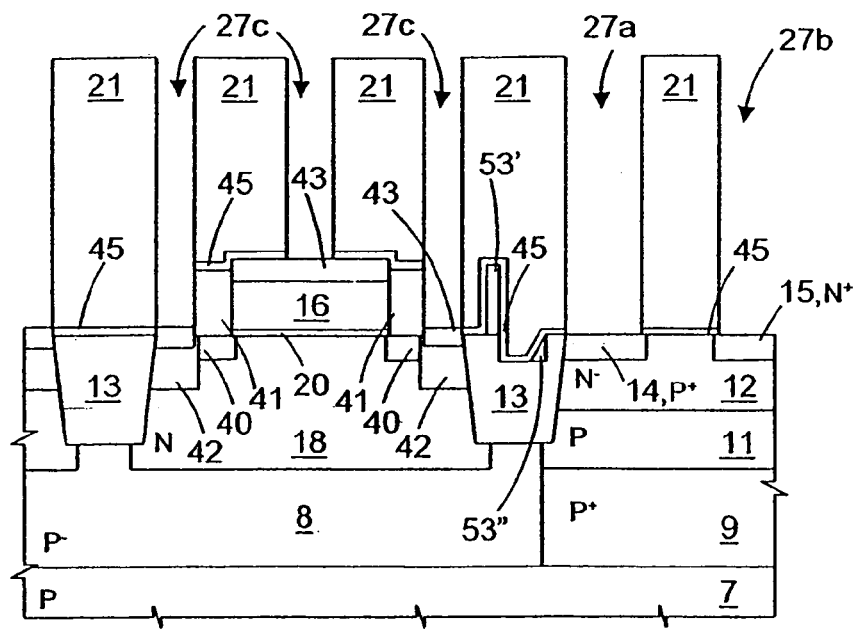

Then, as in the prior process, collector regions 11 and base regions 12 are implanted over the buried subcollector regions 9; and a nitride layer 45 is deposited. The dielectric layer 21 is deposited and planarized; the dielectric layer 21 and nitride layer 45 are etched where contact are to be formed so as to uncover portions of silicide regions 43 and base region 12; base contact regions 15 and emitter regions 14 are implanted into base region 12. Thus, the structure of FIG. 11 is obtained.

Figure 12:
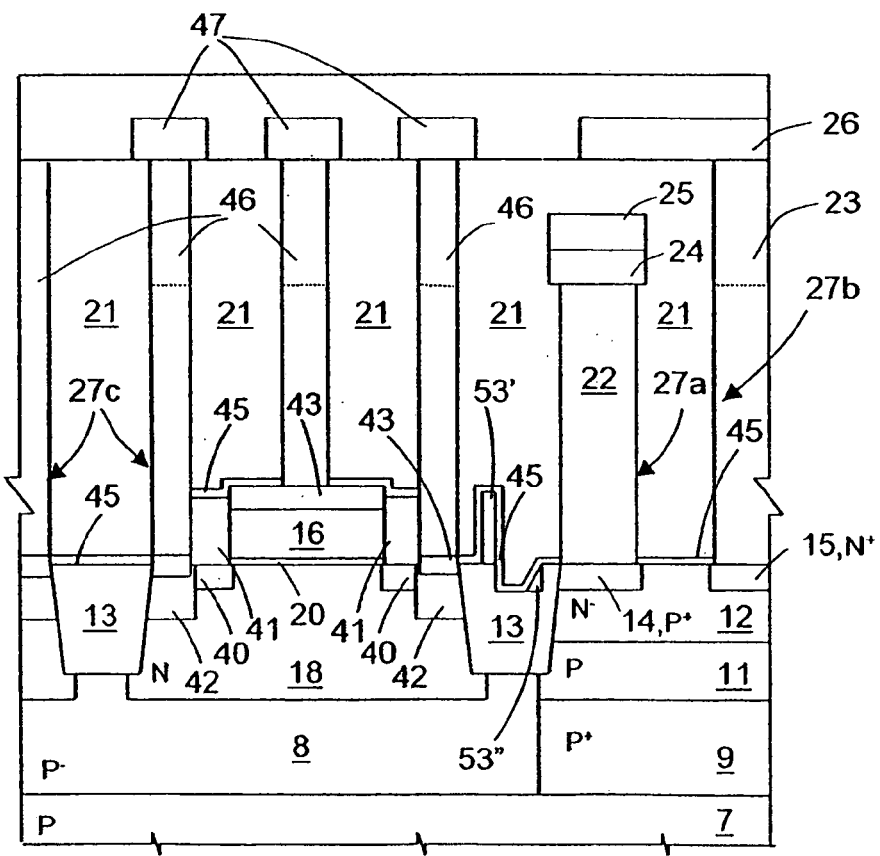

Thereafter, as shown in FIG. 12, contacts 22 and 23 are formed in openings 27a and 27b of the dielectric region 21. Contact 22 extends from emitter region 14 to a chalcogenic storage element 24 forming the programmable element 3 of FIG. 3, to provide a sub-lithographic contact area. Then, bit lines 25 and word lines 26 are formed, analogously to FIG. 6. Contact 23 extends from base contact region 15 to word lines 26. Finally, plugs 46 and contacts 47 are formed in the openings 27c to provide electrical connections to regions 42 and 16.

In practice, the use of the first silicide protection mask 52 including polysilicon portion 16a and oxide portion 20a avoids silicidation of the active areas 60 of the array portion 50 and allows removal of the first silicide protection mask 52 without damaging the active areas 60 and without removing a substantial portion of the field insulation regions 13 near the border of the active areas.

The discussed solution avoids the need of modifying the manufacture steps necessary to form the CMOS transistors as well as the need of using particular processes for transistor manufacture.

The presence of the second silicide protection mask 53 on the first silicide protection mask 52 is advantageous to avoid the problems related to the etching of a silicidated silicon region (portions 16a). In the case that a satisfying technique for removing silicides is available, it is possible to dispense with a second silicide protection mask 53. Furthermore, if the process provides other sacrificial materials preventing silicidation of silicon, for example nitride, these may be used for the second silicide protection mask 53.

The particular layout shown in FIGS. 9–10 wherein the second silicide protection mask 53 extends beyond the first silicide protection mask 52 over the field insulating regions 13 and the resist mask 55 covers the edge of the second silicide protection mask 53 but not the first silicide protection mask 52 is particularly favorable, in that any removal of the oxide of the field insulating regions 13 occurs in a central portion thereof, far from the active area border, thus such removal does not cause any risk of reducing the electrical properties of the field insulating regions nor any short-circuit of the regions formed in the active areas 60. The craters formed in the field insulating regions 13 may be indeed simply filled in any subsequent manufacturing step.

Furthermore, the presence of portions 53' and 53" of the second silicide protection mask 53 over the field insulating regions 13 does not cause any problems. In particular, the height of the remaining portions 53' is comparable with that of the gate electrodes 16 and thus does not hinder the deposit of the following layers.

Any removal of the field insulating regions 13 near to the border of the active areas 60 of the array portion 50 due to the removal of oxide portion 20a is of no importance; due to the reduced height of the oxide portion 20a (e.g., 7 nm) even considering an overetching of 100% (a very high value), a removal of the same entity (7 nm) is at the most obtained, which does not cause problems.

Finally, it is clear that numerous variations and modifications may be made to the cell array as described and illustrated herein, all falling within the scope of the invention as defined in the attached claims. In particular, it is outlined that, although the invention has been particularly devised for electronic devices including a PCM array, the same solution may be applied to other types of devices, having a semiconductor body defining a first portion to be subject to silicidation and a second portion to be protected from silicidation, without damaging the electrical properties of the active area of the second portion or of insulating regions formed in or around the second portion during removal of the silicide protection mask.

All of the above U.S. patents, U.S. patent application publications, U.S. patent applications, foreign patents, foreign patent applications and non-patent publications referred to in this specification and/or listed in the Application Data Sheet, are incorporated herein by reference, in their entirety.

From the foregoing it will be appreciated that, although specific embodiments of the invention have been described herein for purposes of illustration, various modifications may be made without deviating from the spirit and scope of the invention. Accordingly, the invention is not limited except as by the appended claims.

What is claimed is:

1. A process for manufacturing an electronic semiconductor device, comprising:
    forming a body of semiconductor material having an array portion and a circuitry portion;
    forming a gate electrode of a semiconductor material on top of said circuitry portion;
    forming a first silicide protection mask on top of said array portion simultaneously with said step of forming said gate electrode;
    silicidating said gate electrode; and
    removing said first silicide protection mask.

2. A process according to claim 1, wherein said steps of forming a first silicide protection mask and a gate electrode comprise:

depositing a polysilicon layer;
selectively removing portions of said polysilicon layer; and
forming both said gate electrode and said first silicide protection mask from said polysilicon layer.

3. A process according to claim 2, wherein, before depositing a polysilicon layer, an oxide layer is formed onto said body and, after removing said polysilicon layer, uncovered portions of said oxide layer are removed.

4. A process according to claim 1, further comprising the step of forming a second silicide protection mask covering said first silicide protection mask before said step of silicidating said gate electrode.

5. A process according to claim 4, further comprising forming spacers laterally to said gate electrode, said step of forming spacers being performed simultaneously to said step of forming a second silicide protection mask.

6. A process according to claim 5, wherein said step of forming spacers and a second silicide protection mask comprises:
    forming a dielectric layer on top of said body,
    protecting said array portion using an array mask,
    anisotropically etching exposed portions of said dielectric layer; and
    forming both said spacers and said second silicide protection mask from said dielectric layer.

7. A process according to claim 6, wherein said dielectric layer is of a material selected from oxide, nitride and a superposition of oxide and nitride.

8. A process according to claim 4, comprising, after said step of silicidating said gate electrode, removing said second silicide protection mask.

9. A process according to claim 8, wherein said second silicide protection mask has an edge portion extending on a lateral side of said first silicide protection mask on top of an insulating region forming in said body around the array portion, and wherein said steps of removing said first silicide protection mask and removing said second silicide protection mask comprise:
    forming a circuitry mask covering said circuitry portion and part of said insulating region so that an edge of said circuitry mask extends on a central portion of said insulating region and on a part of said edge portion of said second silicide protection mask; and
    etching uncovered portions of said first and second silicide protection masks.

10. A process according to claim 1, further comprising, after said step of removing said first silicide protection mask:
    forming a nitride borderless layer;
    forming an upper insulating layer on said body;
    forming openings in said upper insulating layer and said nitride borderless layer; and
    implanting conduction regions in said array portion.

11. A process according to claim 10, further comprising the step of forming PCM elements of a chalcogenic material in said upper insulating layer.

12. A process according to claim 1, further comprising the step of forming at least one insulating region in said body around said array portion.

13. A process for manufacturing a semiconductor device comprising:
    forming a body of semiconductor material having an array portion and a circuitry portion;
    forming an insulating region in said body around the array portion, said insulating region having a central portion and a border portion abutting said array portion;
    forming a gate electrode of a semiconductor material on top of said circuitry portion;
    forming a first silicide protection mask simultaneously with said step of forming said gate electrode, said first silicide protection mask covering the entire said array portion and having a top and a lateral side, said lateral side reaching on top of the border portion of said insulating region;
    forming a spacer on a side of said gate electrode;
    forming a second silicide protection mask covering the top and the lateral side of said first silicide protection mask, said second silicide protection mask reaching on top of the central portion of said insulating region; and
    silicidating said gate electrode.

14. The process of claim 13 wherein the first silicide protection mask is polysilicon.

15. The process of claim 13 wherein the second silicide protection mask is a sacrificial oxide layer.

16. The process of claim 13, further comprising, after said step of silicidating said gate electrode:
    removing said first and second silicide protection masks;
    forming a nitride borderless layer;
    forming an upper insulating layer on said body;
    forming openings in said upper insulating layer and said nitride borderless layer; and
    implanting conduction regions in said array portion.

17. The process of claim 13 wherein the second silicide protection mask is a sacrificial nitride layer.

18. A process according to claim 17, further comprising the step of forming PCM elements of a chalcogenic material in said upper insulating layer.

* * * * *